(12) United States Patent
Cowley et al.

(10) Patent No.: US 6,638,851 B2
(45) Date of Patent: Oct. 28, 2003

(54) DUAL HARDMASK SINGLE DAMASCENE INTEGRATION SCHEME IN AN ORGANIC LOW K ILD

(75) Inventors: Andy Cowley, Wappingers Falls, NY (US); Erdem Kaltalioglu, Wappingers Falls, NY (US); Michael Stetter, Munich (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/845,305

(22) Filed: May 1, 2001

(65) Prior Publication Data
US 2002/0164870 A1 Nov. 7, 2002

(51) Int. Cl.$^7$ ................. H01L 21/4763; H01L 21/44
(52) U.S. Cl. ................. 438/623; 438/624; 438/626; 438/627; 438/629; 438/637; 438/687
(58) Field of Search ............... 438/736, 622–629, 438/687, 637, 640

(56) References Cited

U.S. PATENT DOCUMENTS

| | | | | |
|---|---|---|---|---|
| 5,858,869 A | * | 1/1999 | Chen et al. | 438/597 |
| 6,027,995 A | | 2/2000 | Chiang et al. | |
| 6,114,253 A | * | 9/2000 | Jang et al. | 438/725 |
| 6,117,782 A | * | 9/2000 | Lukanc et al. | 438/692 |
| 6,140,225 A | * | 10/2000 | Usami et al. | 438/622 |
| 6,140,706 A | * | 10/2000 | Wang et al. | 257/775 |
| 6,174,800 B1 | * | 1/2001 | Jang | 438/629 |
| 6,184,142 B1 | * | 2/2001 | Chung et al. | 216/51 |
| 6,187,672 B1 | | 2/2001 | Zhao et al. | |
| 6,197,678 B1 | | 3/2001 | Yu | |
| 6,225,217 B1 | * | 5/2001 | Usami et al. | 438/622 |
| 6,274,483 B1 | * | 8/2001 | Chang et al. | 438/640 |
| 6,355,575 B1 | * | 3/2002 | Wang et al. | 438/712 |
| 2001/0016405 A1 | * | 8/2001 | Nguyen et al. | 438/586 |

OTHER PUBLICATIONS

Wolf, et al. Silicon Processing for the VLSI Era, vol. 1—Process Technology, 2nd ed., Lattice Press: Sunset Beach CA, 2000, pp. 782–785, 791–795.*

* cited by examiner

Primary Examiner—Erik Kielin

(57) ABSTRACT

Process of making a semiconductor using dual inorganic hardmask in single damascene process integration scheme in an organic low k interlayer dielectric (ILD) by:
  providing semiconductor substrate;
  depositing organic low k ILD layer on substrate;
  forming hardmask 1 on organic low k ILD layer and forming sacrificial hardmask 2 on hardmask 1;
  forming a patterned photoresist layer on sacrificial hardmask 2;
  etching selective to sacrificial hardmask 2 and stripping photoresist;
  etching of hardmask 1 in which the etch is selective to the organic low k ILD layer;
  depositing a liner or conformal barrier layer over the substrate, organic low k ILD layer, hardmask 1 and hardmask 2;
  forming a plated metal layer over the liner or conformal barrier layer; and
  removing metal layer and removing liner with simultaneous removal of sacrificial hardmask 2 so that facets in sacrificial hardmask 2 are removed during liner/sacrificial hardmask 2 removal.

15 Claims, 2 Drawing Sheets

DUAL HARDMASK SINGLE DAMASCENE INTEGRATION SCHEME IN AN ORGANIC LOW K ILD

BACKGROUND OF THE INVENTION

1. Field of the Invention

The present invention relates to the use of a dual hardmask single damascene integration scheme in an organic low k ILD (interlayer dielectric) to affect patterning of single damascene features without feature to feature short circuits due to hardmask erosion in the patterned etched process. The process also permits photoresist removal in an oxidizing plasma without attack of the organic ILD materials.

2. Description of Prior Art

Dual hardmasks have been used extensively in dual damascene structures with organic ILD materials; however, they are employed principally to allow formation of the dual damascene structure without the requirement for an etch stop layer between the line and the via ILD's.

Further, single hardmask for single damascene structures in organic ILD material is known; however, it has been demonstrated that this known approach is insufficient with sub 0.18 $\mu$m features and does not allow removal of the photoresist without attacking the organic ILD.

In general, a damascene process is one kind of interconnect process. The damascene process forms the trench in a dielectric layer. Thereafter, a metal layer is formed in the trench to form a conductive line as an interconnect.

A dual damascene process is one kind of multilevel interconnect process, in which a contact or a via is additionally formed as an interconnect.

FIGS. 1–5 show schematics of cross-sectional views of a prior art damascene process.

From FIG. 1, it can be seen that a semiconductor substrate 10 has a dielectric layer 11 formed thereon. By use of a chemical-mechanical polishing (CMP) process, the dielectric layer 11 is planarized. On top of the planarized dielectric layer is a patterned photoresist layer 12.

By using the photoresist layer 12 as a mask, as shown in FIG. 2, the dielectric layer 11 is etched by dry etching to form a trench 13.

The photoresist layer 12, as shown in FIG. 3 is removed by an oxygen plasma, and a metal plug 14 is formed in the trench 13 to complete the damascene process. When a dual damascene process is performed, the process becomes more complicated.

For example, in the conventional process, an oxide with a low dielectric coefficient is used as the dielectric layer 11. Further, the oxide layer usually includes the spin-on polymer (SOP) characterized by a polymer-like structure. When removing the photoresist layer with oxygen plasma, the SOP layer characterized by the polymer-like structure is readily damaged by the oxygen plasma. Accordingly, the process is not workable for removing the photoresist layer by oxygen plasma.

This being the case, an improved process is to form a cap oxide layer between the dielectric layer and the photoresist layer as shown in another conventional damascene process in the schematics of FIGS. 4 and 5.

As may be seen from FIG. 4, a dielectric layer 11 is formed over a substrate 10, whereupon a cap oxide layer 15 is formed on the dielectric layer 11. A patterned photoresist layer 12 is formed on the cap oxide layer 15.

From FIG. 5, it can be seen that the photoresist layer 12 has been removed by an oxygen plasma. Thereafter, using the cap oxide layer 15 as a hard mask, the dielectric layer 11 is etched to form a trench 13.

In the traditional or conventional method, use of the cap oxide layer 15, makes the process more complicated. Further, when etching the dielectric oxide layer with a low dielectric coefficient to form the trench, a gas with oxygen is typically used as the etching gas source. However, when using a gas with oxygen, the dielectric layer is readily damaged during the etching process.

U.S. Pat. No. 6,197,678 B1 disclose a damascene process comprising:

providing a semiconductor substrate;

forming a patterned mask layer over the substrate;

forming a spin-on polymer layer on a portion of the substrate exposed by the mask layer, wherein an upper surface of the spin-on polymer layer is lower than an upper surface of the mask layer upon formation and the spin-on polymer layer does not cover the upper surface of the mask layer;

removing the mask layer to form an opening in the spin-on polymer layer;

forming a conformal barrier layer on the substrate and the spin-on polymer layer; and forming a metal plug in the opening.

A method is provided for forming an improved interconnect structure on a semiconductor body in U.S. Pat. No. 6,187,672 B1. The method comprises:

(a) depositing a first metal layer on a semiconductor body;

(b) depositing a sacrificial layer on the first metal layer, the sacrificial layer having a height;

(c) patterning the sacrificial layer and the first metal layer to form separate metal lines with a sacrificial layer cap on the metal lines;

(d) depositing a low-k material to fill gaps between the metal lines and to cover the sacrificial layer;

(e) removing the low-k material to a level within the height of the sacrificial layer;

(f) removing the sacrificial layer;

(g) depositing a protective layer to cover the metal lines and the low-k material (h) depositing an insulator on the protective layer; depositing and patterning a photoresist layer on the insulator;

(i) creating vias in the insulator;

(j) performing a photoresist strip (k) performing a set clean; and (l) selectively etching the protective layer using an anisotropic etch configured to leave a spacer on a vertical portion of the low-k material in the vias.

U.S. Pat. No. 6,027,995 disclose a method for fabricating an interconnect system, comprising:

a. providing a silicon substrate;

b. forming a first dielectric layer upon the silicon substrate;

c. forming a first level of at least two electrically conductive lines upon the first dielectric layer;

d. forming a first region of low dielectric constant material upon and between the at least two first level electrically conductive lines, the dielectric constant of the material forming the first region of low dielectric constant material having a range of 1.5 to 3.5; and e. forming a hard mask upon the first region, wherein a thickness of the first region material measured between the first dielectric layer and the hard mask is in the range of 8,000 to 14,000 Angstroms.

There is a need in the art of preparing microelectronic devices, especially in the BEOL (back-end-of-the-line) semiconductor structures to provide an inorganic (silicon oxide and silicon nitride) dual hard mask in a single damascene integration scheme to allow: removal of the photoresist masking material in an oxidizing plasma without attack of the organic ILD material.

There is a further need in the art of fabricating semiconductor devices of the BEOL (back-end-of-the-line) structures to employ an inorganic (silicon oxide and silicon nitride) dual hard mask in a single damascene integration scheme to allow: prevention of feature to feature short circuits by using a sacrificial hard mask which is eroded during the organic ILD etch process that is subsequently removed by CMP (chemical mechanical polishing).

SUMMARY OF THE INVENTION

One object of the present invention is to provide a dual hard mask single damascene integration scheme in an organic low k ILD to allow removal of the photoresist masking material in an oxidizing plasma without attack of the organic ILD material.

A further object of the present invention is to provide a dual hard mask single damascene integration scheme in an organic low k ILD to allow prevention of feature-to-feature short circuits by using a sacrificial hard mask which is eroded during the organic ILD etch process and is subsequently removed by CMP (chemical mechanical polishing).

These and other objects of the invention will be more fully appreciated by resorting to the drawing figures and the detailed description of the preferred embodiment of the invention.

Thereafter, the photoresist is stripped while the organic ILD layer is protected by hardmask 1.

Figure 7:
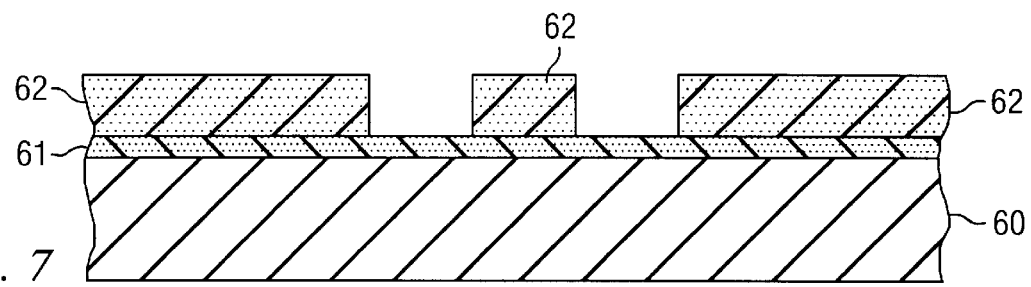
FIG. 7 depicts the next step after FIG. 6 of the invention process in which an etch is performed that is selective to hardmask 2 and wherein hardmask 1 serves as an etch stop.
Figure 8:
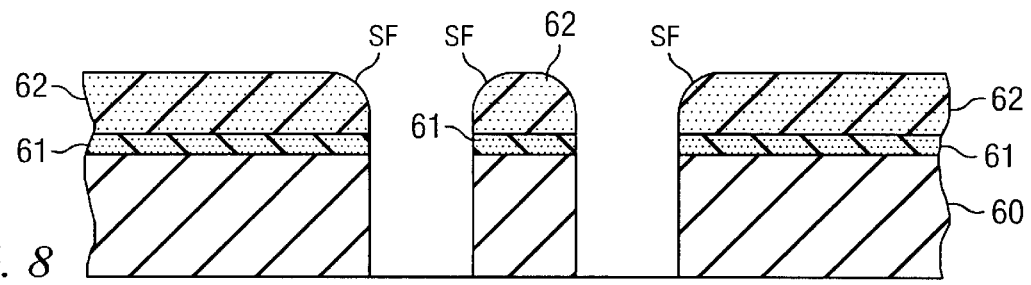

FIG. 8 proceeds from FIG. 7 and shows the etch of hardmask 1 that is selective to the organic ILD layer, showing etch of the organic ILD layer masked by hardmask 2, and in which hardmask 2 is severely faceted SF due to ion sputtering at the 90 degree corners.

Figure 9:
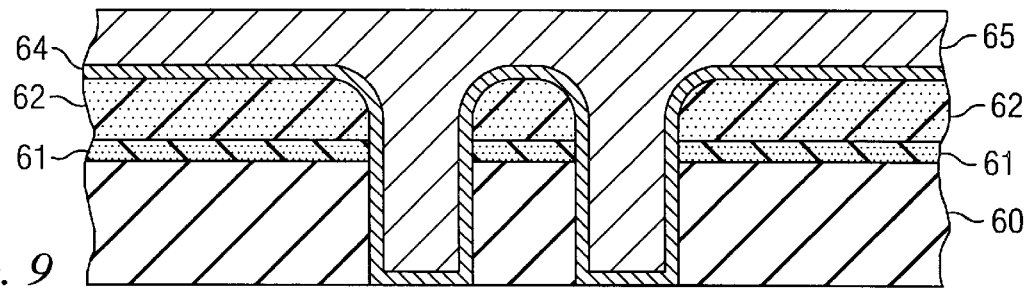

FIG. 9 depicts a continuation of the invention process of FIG. 8 in which a conformal liner or barrier layer is formed over the substrate, organic ILD layer, hardmask 1 and hardmask 2, followed by copper seed and copper plating depositions.

Figure 10:
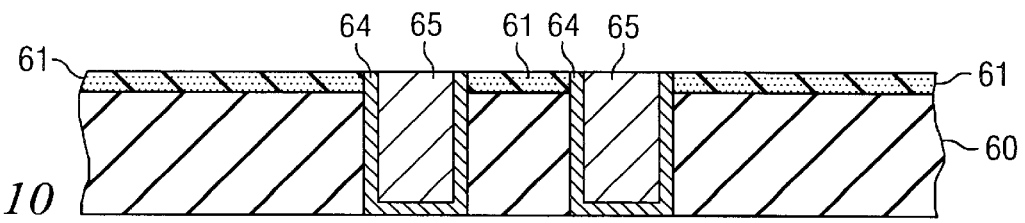

FIG. 10 depicts the invention process continued from FIG. 9 in which the copper layer is removed by CMP, and the liner is removed by CMP along with simultaneous removal of sacrificial hardmask 2. The facet in hardmask 1 is removed during the liner/hardmask 1 CMP process.

DETAILED DESCRIPTION OF PREFERRED EMBODIMENT OF THE INVENTION

Figure 1:
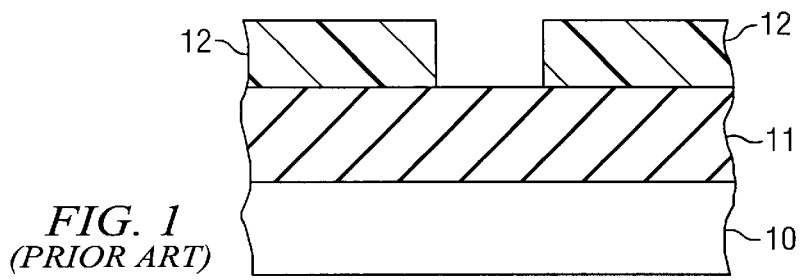
FIG. 1 is a schematic, cross-sectional view of a prior art damascene process commencing with a substrate on which a dielectric layer is formed, and containing a patterned photoresist layer on the dielectric layer.
Figure 2:
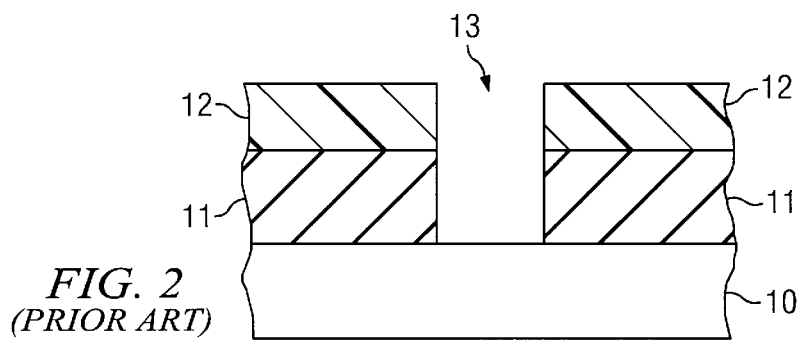
FIG. 2 is a schematic, cross-sectional view showing the etched dielectric layer from FIG. 1, and etched by dry etching to form a trench.
Figure 3:
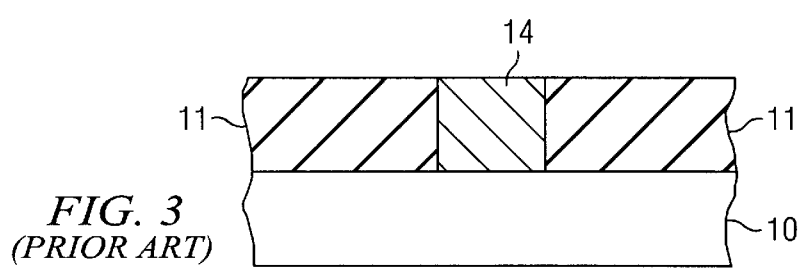
FIG. 3 is a schematic, cross-sectional view of a prior art damascene process in which the photoresist layer has been removed by oxygen plasma and wherein a metal plug is formed in the trench to complete the damascene process.
Figure 4:
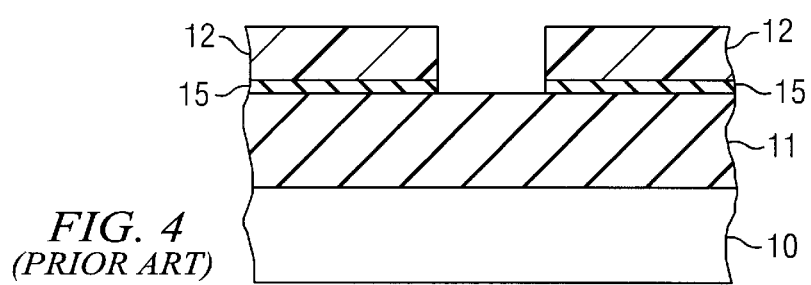
FIG. 4 is a schematic, cross-sectional view of a prior art damascene process in which a cap oxide layer is formed between the dielectric layer and the photoresist layer.
Figure 5:
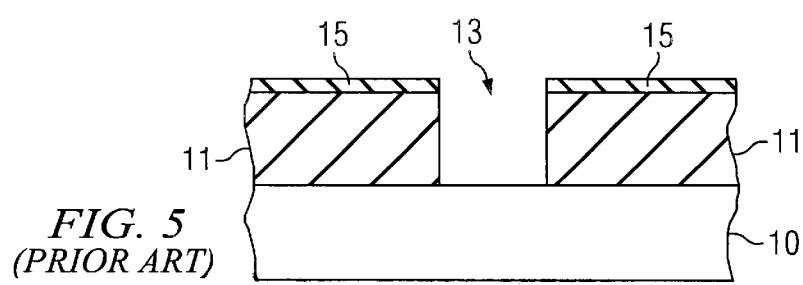
FIG. 5 shows the progression of the process from FIG. 4 in which a patterned photoresist layer is formed on the cap oxide layer, wherein the photoresist layer is removed by oxygen plasma, and the cap oxide layer is used as a hardmask while the dielectric layer is etched to form a trench.
Figure 6:
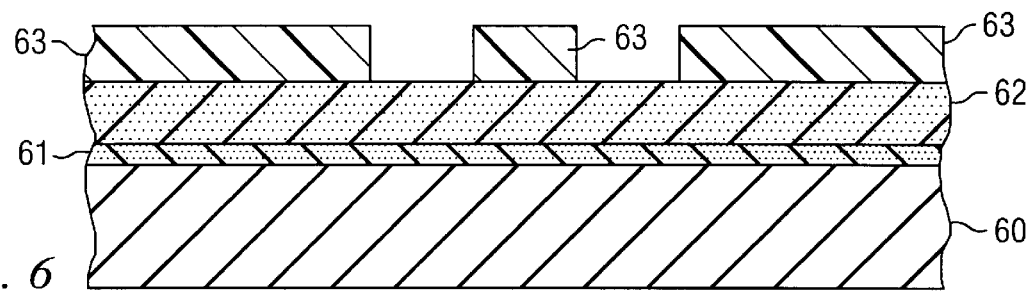
FIG. 6 is a schematic of the dual hardmask single damascene integration scheme of the invention process depicting a substrate on which an organic ILD layer is formed. Hardmasks layers 1 and 2 are formed on the organic ILD layer. A patterned photoresist layer is then formed on the second hardmask layer.

Reference is now made to FIG. 6 which shows a schematic of the commencing steps of the dual hard mask single damascene integration scheme in an organic low k ILD, wherein an organic ILD layer 60 is formed on a substrate. Thereafter, hard mask layer 1 (61) and hardmask layer 2 (62) are sequentially formed on top of the substrate (so that hardmask 2 is immediately formed on top of hardmark 1). A patterned photoresist layer 63 is then formed on hardmask layer 2. The photoresist layer is defined by photolithography and etching.

An etch selective to hardmask 2 but one in which hard mask 1 serves as an etch-stop is then performed as shown by FIG. 7. Thereafter, the photoresist is stripped or removed (i.e. by oxygen plasma) while the organic ILD layer is protected by hardmask 1.

As can be seen from FIG. 8, the etch of hardmask 61 is selective to the organic ILD layer 60 masked by hardmask 2 (62), and in which hardmask 2 is severely faceted SF due to ion sputtering at the 90 degree corners.

A conformal barrier layer or liner 64 is formed on the substrate, hardmask 1 and hardmask 2. The barrier may include tantalum nitride (TaN) or tantalum/tantalum nitride (Ta/TaN) and may be accomplished by chemical vapor deposition (CVD). A metal layer is then formed over the barrier layer, and may be accomplished by use of a Cu seed and Cu plating 65.

Chemical mechanical polishing (CMP) is utilized to remove the plated copper as shown in FIG. 10, followed by CMP removal of the liner along with simultaneous removal of sacrificial hardmask 2. The facet in hardmask 2 is removed during the liner/hardmask 2 CMP process.

The invention dual hardmask single damascene integration scheme in an organic low k ILD eliminates feature to feature short circuits due to hardmask erosion in the pattern etch process. Also, the invention process permits photoresist removal in an oxidizing plasma without attack of the organic ILD material.

Significantly, the invention process allows formation of isolated single damascene features at sub $0.18\mu$ design rules without shorts and avoids more complex integration schemes at potentially higher cost.

It will be apparent to skilled practitioners in the art that many modifications and variations may be made to the invention process without departing from the scope or spirit of the invention, which is defined by the following claims and their equivalents.

We claim:

1. A process of using an inorganic dual hardmask in a single damascene process integration scheme to allow formation of isolated single damascene features at sub 0.18 μ design rules in an organic low k interlayer for patterning of single damascene features without causing feature-to-feature short circuits due to hardmask erosion and to permit removal of photoresist in an oxidizing plasma without attack of the organic ILD materials dielectric (ILD) when making a semiconductor, comprising:

a) providing a semiconductor substrate;

b) depositing an organic low k ILD layer on said substrate;

c) forming a inorganic hardmask 1 on said organic low k ILD layer and forming a sacrificial inorganic hardmask 2 on inorganic hardmask 1;

d) forming a patterned photoresist layer on sacrificial inorganic hardmask 2;

e) severely faceting sacrificial inorganic hardmask 2 by ion sputtering at the 90 degree corners by performing an etch selective to sacrificial inorganic hardmask 2 and stripping said photoresist with an oxygen plasma, a reagent having oxygen or a reagent of 1-methyl-2 pyrrolidine without attack of said organic low k ILD layer;

f) performing an etch of inorganic hardmask 1 in which the etch is selective to said organic low k ILD layer;

g) depositing a liner or conformal barrier layer over the substrate, organic low k ILD layer, inorganic hardmask 1 and sacrificial inorganic hardmask 2;

h) forming a plated metal layer over the liner or conformal barrier layer; and i) removing said metal layer and removing said liner or conformal barrier layer with simultaneous removal of sacrificial inorganic hardmask 2 in a manner such that facets in sacrificial inorganic hardmask 2 are removed during liner/sacrificial inorganic hardmask 2 removal.

2. The process of claim 1 wherein said organic low k interlayer is selected from the group consisting of polyimide, polysilsequioxane, benzocyclobutene (BCB), parylene N, fluorinated polyimide, parylene F, and amorphous Teflon.

3. The process of claim 1 wherein said organic low k interlayer is selected from the group consisting of polyimide, polysilsesquioxane, benzocyclobutene (BCB), parylene N, fluorinated polyimide, parylene F, and amorphous polytetrafluoroethylene.

4. The process of claim 2 wherein said organic low k interlayer is polysilsesquioxane.

5. The process of claim 2 wherein said organic low k interlayer is benzocyclobutene (BCB).

6. The process of claim 2 wherein said organic low k interlayer is parylene N.

7. The process of claim 2 wherein said organic low k interlayer is fluorinated polyimide.

8. The process of claim 2 wherein said organic low k interlayer is parylene F.

9. The process of claim 2 wherein said organic low k interlayer is amorphous polytetrafluoroethylene.

10. The process of claim 2 wherein in step e) hardmask 1 serves as an etchstop.

11. The process of claim 10 wherein said conformal barrier layer is deposited by chemical vapor deposition (CVD).

12. The process of claim 11 wherein said conformal barrier layer is selected from TaN or Ta/TaN.

13. The process of claim 12 wherein said barrier layer is TaN.

14. The process of claim 12 wherein said barrier layer is Ta/TaN.

15. The process of claim 12 wherein said metal layer is Cu.

\* \* \* \* \*